(12) United States Patent
Kim et al.

(10) Patent No.: US 9,214,787 B2
(45) Date of Patent: Dec. 15, 2015

(54) III-V PHOTONIC CRYSTAL MICROLASER BONDED ON SILICON-ON-INSULATOR

(71) Applicant: CALIFORNIA INSTITUTE OF TECHNOLOGY, Pasadena, CA (US)

(72) Inventors: Seheon Kim, San Jose, CA (US); William Dos Santos Fegadolli, Pasadena, CA (US); Axel Scherer, Barnard, VT (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 14/690,198

(22) Filed: Apr. 17, 2015

(65) Prior Publication Data
US 2015/0222092 A1     Aug. 6, 2015

Related U.S. Application Data

(62) Division of application No. 14/139,799, filed on Dec. 23, 2013, now Pat. No. 9,042,418.

(60) Provisional application No. 61/763,095, filed on Feb. 11, 2013.

(51) Int. Cl.
| | |
|---|---|
| *H01S 5/00* | (2006.01) |
| *H01S 5/227* | (2006.01) |
| *H01S 5/10* | (2006.01) |
| *B82Y 20/00* | (2011.01) |
| *H01S 5/20* | (2006.01) |
| *H01S 5/22* | (2006.01) |
| *H01S 5/30* | (2006.01) |
| *H01S 5/02* | (2006.01) |
| *H01S 5/026* | (2006.01) |
| *H01S 5/042* | (2006.01) |
| *H01S 5/32* | (2006.01) |
| *H01S 5/343* | (2006.01) |

(52) U.S. Cl.
CPC ............... *H01S 5/2275* (2013.01); *B82Y 20/00* (2013.01); *H01S 5/105* (2013.01); *H01S 5/1028* (2013.01); *H01S 5/1042* (2013.01); *H01S 5/2045* (2013.01); *H01S 5/2228* (2013.01); *H01S 5/3013* (2013.01); *H01S 5/021* (2013.01); *H01S 5/026* (2013.01); *H01S 5/0425* (2013.01); *H01S 5/3213* (2013.01); *H01S 5/34306* (2013.01); *H01S 2304/00* (2013.01); *H01S 2304/02* (2013.01)

(58) Field of Classification Search
CPC ... H01S 5/2275; H01S 5/3013; H01S 5/2045; H01S 5/2228; H01S 5/1028; H01S 5/105; H01S 5/1042; H01S 2304/00; H01S 2304/02; H01S 5/0425; H01S 5/3213; H01S 5/34306; H01S 5/026; H01S 5/021; B82Y 20/00
See application file for complete search history.

(56) References Cited

U.S. PATENT DOCUMENTS

| | | | | |
|---|---|---|---|---|
| 6,643,439 | B2* | 11/2003 | Notomi et al. | 385/125 |
| 6,711,200 | B1* | 3/2004 | Scherer et al. | 372/64 |
| 2004/0135155 | A1* | 7/2004 | Otsuka et al. | 257/79 |
| 2007/0013991 | A1* | 1/2007 | Kise et al. | 359/245 |
| 2010/0284432 | A1* | 11/2010 | Hoshino et al. | 372/44.011 |
| 2010/0288341 | A1* | 11/2010 | Kim et al. | 136/252 |

* cited by examiner

*Primary Examiner* — Yuanda Zhang
(74) *Attorney, Agent, or Firm* — Steinfl & Bruno LLP (57) ABSTRACT

Novel methods and systems for miniaturized lasers are described. A photonic crystal is bonded to a silicon-on-insulator wafer. The photonic crystal includes air-holes and can include a waveguide which couples the laser output to a silicon waveguide.

4 Claims, 10 Drawing Sheets

III-V PHOTONIC CRYSTAL MICROLASER BONDED ON SILICON-ON-INSULATOR

CROSS REFERENCE TO RELATED APPLICATIONS

The present application is a Divisional of U.S. patent application Ser. No. 14/139,799 filed on Dec. 23, 2013 which claims priority to U.S. Provisional Patent Application No. 61/763,095, filed on Feb. 11, 2013, the disclosures of both of which are incorporated herein by reference in their entirety.

TECHNICAL FIELD

The present disclosure relates to microlasers. More particularly, it relates to III-V photonic crystal microlasers bonded on silicon-on-insulator.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

In a first aspect of the disclosure, a photonic crystal microlaser structure is described, the structure comprising: a first electrode; a silicon layer, contacting the first electrode; a silicon dioxide layer, contacting the silicon layer; a silicon photonic crystal region, contacting the silicon dioxide layer; a III-V semiconductor photonic crystal region, contacting the silicon photonic crystal region; and a second electrode, contacting the III-V semiconductor photonic crystal region.

In a second aspect of the disclosure, a method for fabricating a photonic crystal microlaser structure is described, the method comprising: providing a silicon-on-insulator substrate, the silicon-on-insulator substrate comprising a silicon substrate; a silicon dioxide layer contacting the silicon substrate; and a silicon layer contacting the silicon dioxide layer; providing a III-V semiconductor substrate; depositing a p-type layer on the III-V semiconductor substrate; depositing a quantum well structure on the p-type layer; depositing an n-type layer on the quantum well structure; bonding the n-type layer to the silicon layer; depositing a first electrode on the III-V semiconductor substrate; defining a mesa structure, the mesa structure comprising the first electrode; the III-V semiconductor substrate; the quantum well structure; the p-type layer; and the silicon layer; depositing a second electrode on the n-type layer; defining air-holes in the mesa structure, wherein the mesa structure comprises a center region, an edge region, and a remaining region, the remaining region having a greater area than the sum area of the center region and of the edge region, and wherein the air holes are periodically arranged in the remaining region, thereby creating a photonic crystal structure with a resonator and a photonic crystal waveguide; and defining a silicon ridge waveguide, the silicon ridge waveguide being configured to couple to the photonic crystal waveguide.

DETAILED DESCRIPTION

The present disclosure relates to III-V semiconductor microlasers. More specifically, this invention describes an ultra-small photonic crystal microlaser which can be integrated into an existing silicon photonics platform. In some embodiments, an electrically-pumped laser device architecture is provided along with a scheme for the laser output to couple to a silicon ridge waveguide. The proposed design is fully compatible with today's standard CMOS (Complementary Metal Oxide Semiconductor) fabrication process.

Silicon CMOS-integrated photonics are becoming more and more important in the context of burgeoning Internet Data Centers (IDCs) and High-Performance Computing Systems (HPCSs). These applications require high-bandwidth all optical data processing at beyond 100 Gbit/sec. Today's most advanced silicon CMOS-integrated nano-photonics technology can provide a cost-effective, easily scalable solution in conjunction with the Wavelength Division Multiplexing (WDM) scheme. For example, as known to the person skilled in the art, a representative architecture can process 40 parallel wavelength channels at 25 Gbit/sec includes Germanium (Ge) photodetectors and high-speed electro-optic modulators on a single CMOS die with an area as small as 25 mm$^2$. In such an exemplary platform, a light source is provided externally in the form of WDM Distributed Feedback (DFB) lasers supporting the required number of WDM channels.

In another example, directly modulated micro ring resonators create 10 Gbit/sec on-off keying signals. An advantage in using micro ring resonators is their relatively low threshold current below 10 mA, which further implies lower power budget and less generation of heat in the system.

Though today's WDM technology greatly helps to effectively overcome the speed barrier of 100 Gbit/sec, ever faster processors can be required. Along with the faster modulation speed, the more densely integrated optical elements (such as resonators and waveguides) can also be required. To achieve these goals, one must develop a power efficient, ultra-fast nanolaser that can be integrated into the existing CMOS-compatible silicon photonics platform.

One consequence of achieving the miniaturization of a laser is to shrink the size of the ring resonators which are conventionally used. As will be understood by the person skilled in the art, miniaturization can have at least two unwanted consequences: i) excessive heat generation due to the increase in the device's resistance and ii) a lower quality factor of the ring resonator mode.

To overcome these two difficulties, a new type of nanolaser based on photonic crystals can be used. This nanolaser can be easily integrated into the silicon photonics platform, for example as described in Fegadolli et al., "Hybrid single quantum well InP/Si nanobeam lasers for silicon photonics", Opt. Lett., Vol. 38, 4656-4658 (2013), the disclosure of which is incorporated herein by reference in its entirety. A typical optical mode size of the photonic crystal laser will be roughly 100 times smaller than that of the ring resonator. As known to the person skilled in the art, reduction in size is one of the key driving force for further improvement in the modulation speed.

It is expected that a small mode volume, as that possible with the present disclosure, along with the use of a reasonable p-i-n diode configuration, can enable over 100 Gbit/sec modulation from a single laser source.

In some embodiments, an InP/InGaAsP system can be used, emitting at 1.55 micrometers (a telecommunication wavelength). In some embodiments, a triangular lattice of air-holes can be used as a photonic crystal. These embodiments are not meant as a limitation, and other material systems and/or photonic crystal may be used, for example for various operational wavelengths and/or different crystalline symmetry of the photonic crystal. For example, for operation in the 850 nm wavelength, GaAs/AlGaAs systems may be used. In some embodiments, square-lattice photonic crystals or even quasi-crystals may be used. Quasi-crystals are described, for example, in Nozaki et al., "Quasiperiodic photonic crystal microcavity lasers," Appl. Phys. Lett. Vol. 84, 4875 (2004), the disclosure of which is incorporated herein by reference in its entirety.

Silicon-on-insulator (SOI) wafers are most commonly employed for silicon photonics. So far, many different strategies have been tried out in an effort to incorporate gain media into silicon toward built-in lasers. One of the potential ideas is to directly bond III-V active wafers on the SOI wafer. This type of bonding can be achieved, for example, through chemical activation of both the surfaces of the III-V wafer and the SOI wafer, by the hydroxyl group (—OH).

Subsequently, a pressure of 1 MPa can be applied, at a relatively low temperature of 300 degrees, to obtain strong covalent bonding. An exemplary procedure is described, for example, in D. Liang et al., "Highly efficient vertical outgassing channels for low-temperature InP-to-silicon direct wafer bonding on the silicon-on-insulator substrate," J. Vac. Sci. Technol. B, Vol. 26, 1560 (2008), the disclosure of which is incorporated herein by reference in its entirety. Uniform, void-free, wafer scale bonding is possible using the above technique.

Figure 1:
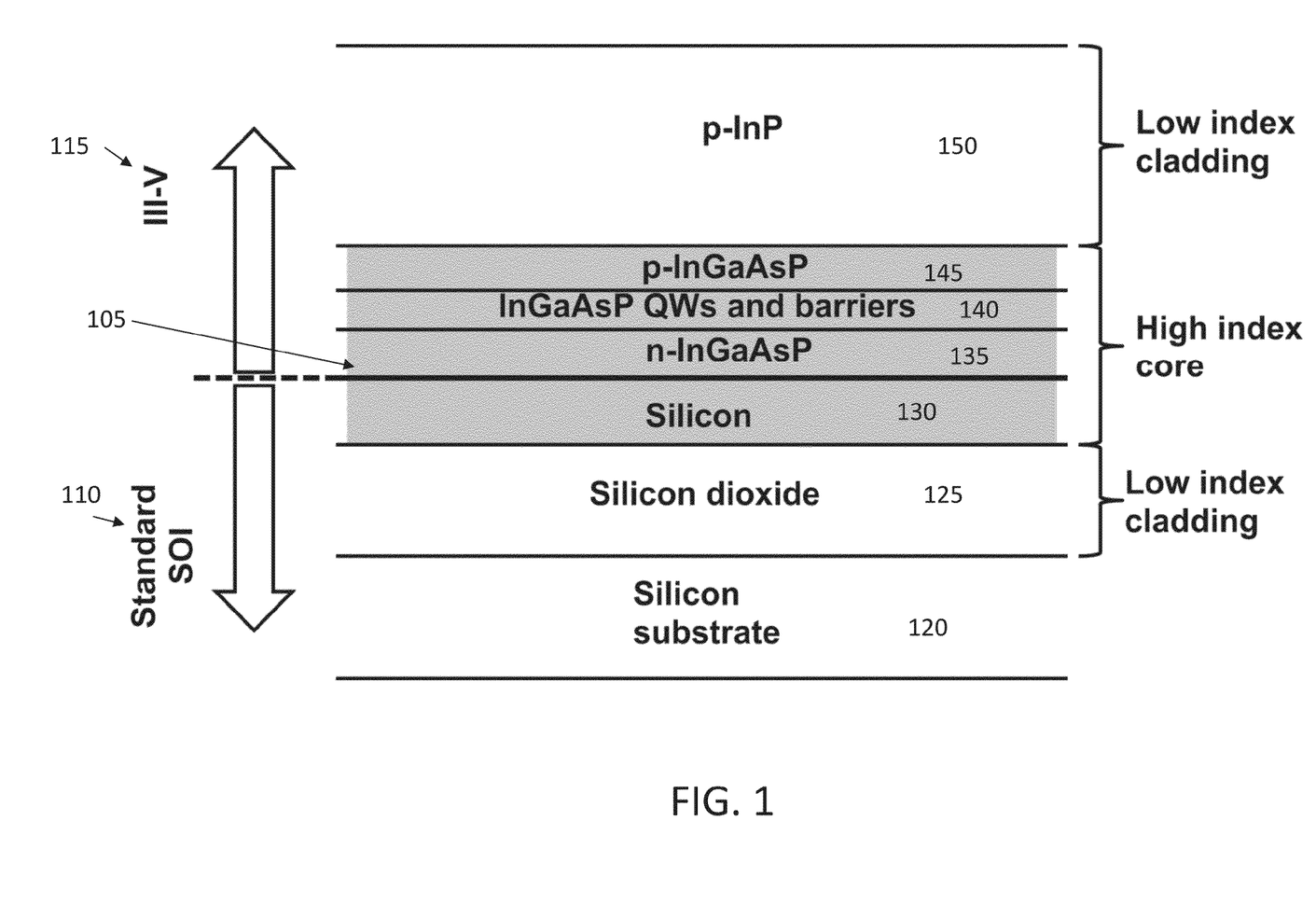
FIG. 1 illustrates an exemplary wafer structure of an active light source within a silicon photonics integrated circuit.

FIG. 1 illustrates an exemplary wafer structure of an active light source within a silicon photonics integrated circuit.

Referring to FIG. 1, a bonding interface (105) is visible, situated between a SOI wafer (110) and a III-V wafer (115). The SOI wafer (110) comprises a silicon substrate (120), a silicon dioxide layer (125), and a silicon layer (130). In some embodiments, such as in FIG. 1, the III-V wafer (115) may comprise a n-InGaAsP layer (135), a InGaAsP quantum well (QW) layer (140), a p-InGaAsP layer (145) and a p-InP layer (150). Layer (140) may comprise barriers, as understood by the person skilled in the art.

In the example of FIG. 1, the layers (135, 140, 145, 150) in the III-V wafer (115) may be grown epitaxially on an InP substrate. A typical thickness of the p-InP layer (150) can be between 1 micrometers and 1.5 micrometers.

It may be advantageous to locate layers having slightly higher refractive indices close to the silicon layer (130). It should be noted that pure InP has a refractive index of 3.168 at a wavelength of 1.55 micrometers, while typically InGaAsP QWs and barriers can have slightly higher refractive indices, around 3.40. Therefore, a refractive index contrast of about 0.2 could be achieved based on the InP/InGaAsP system. Therefore, the layers (130, 135, 140, 145) form a high refractive index core region for optical confinement, while layer (150) and layer (125) have a low refractive index relative to the core region.

Figure 2:
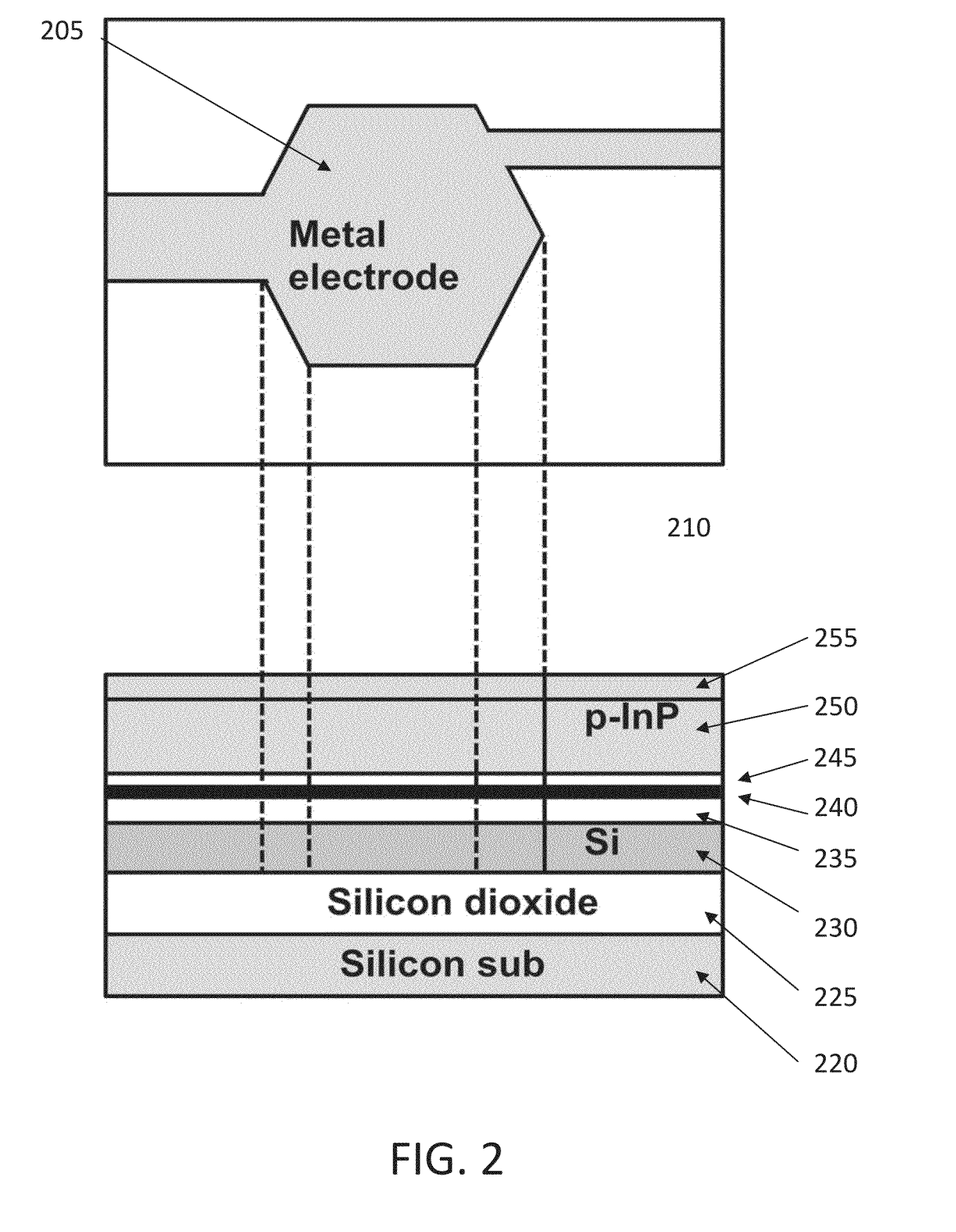
FIG. 2-5 illustrates exemplary steps to fabricate an active microlaser.
Figure 3:
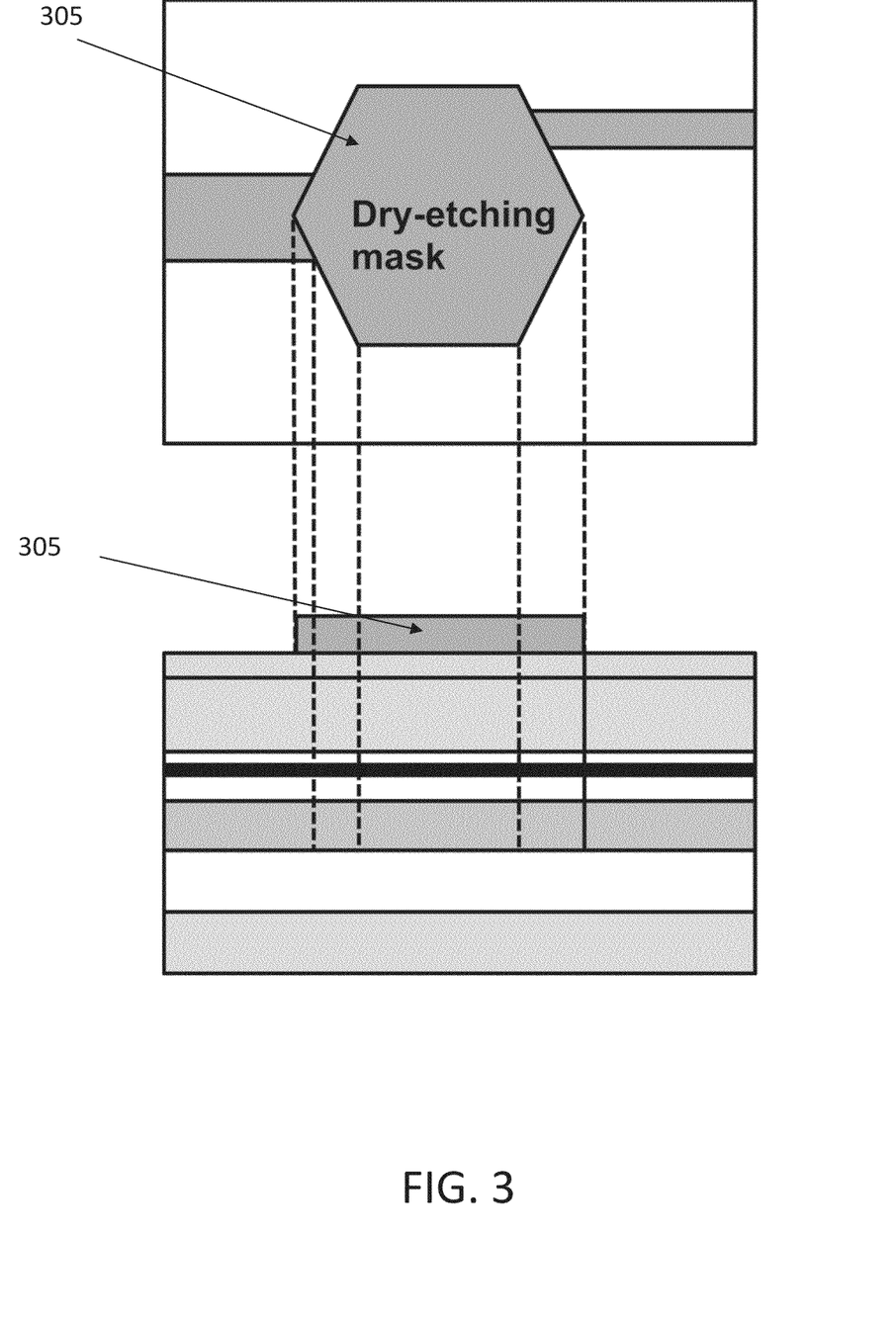
Figure 4:
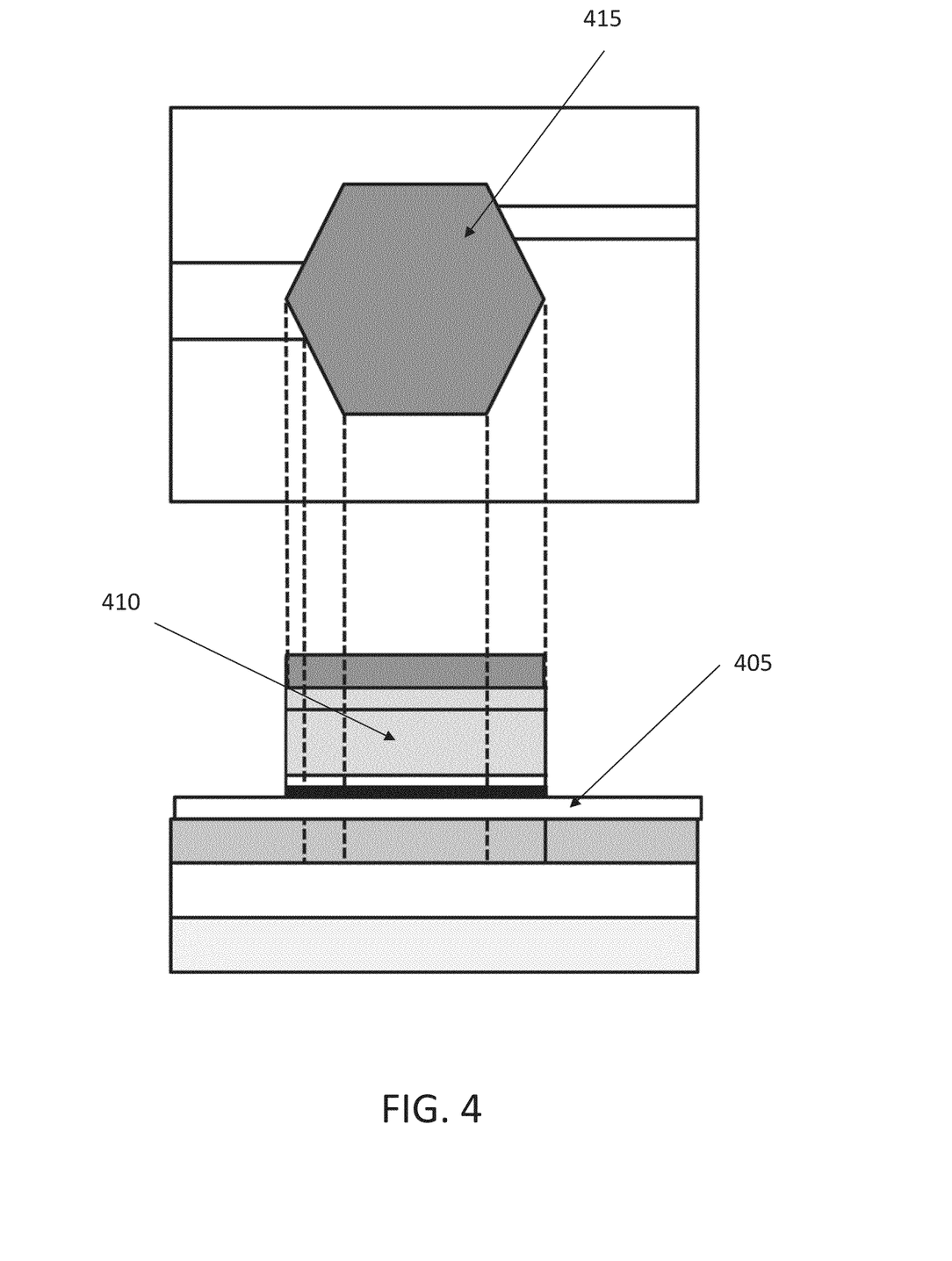
Figure 5:
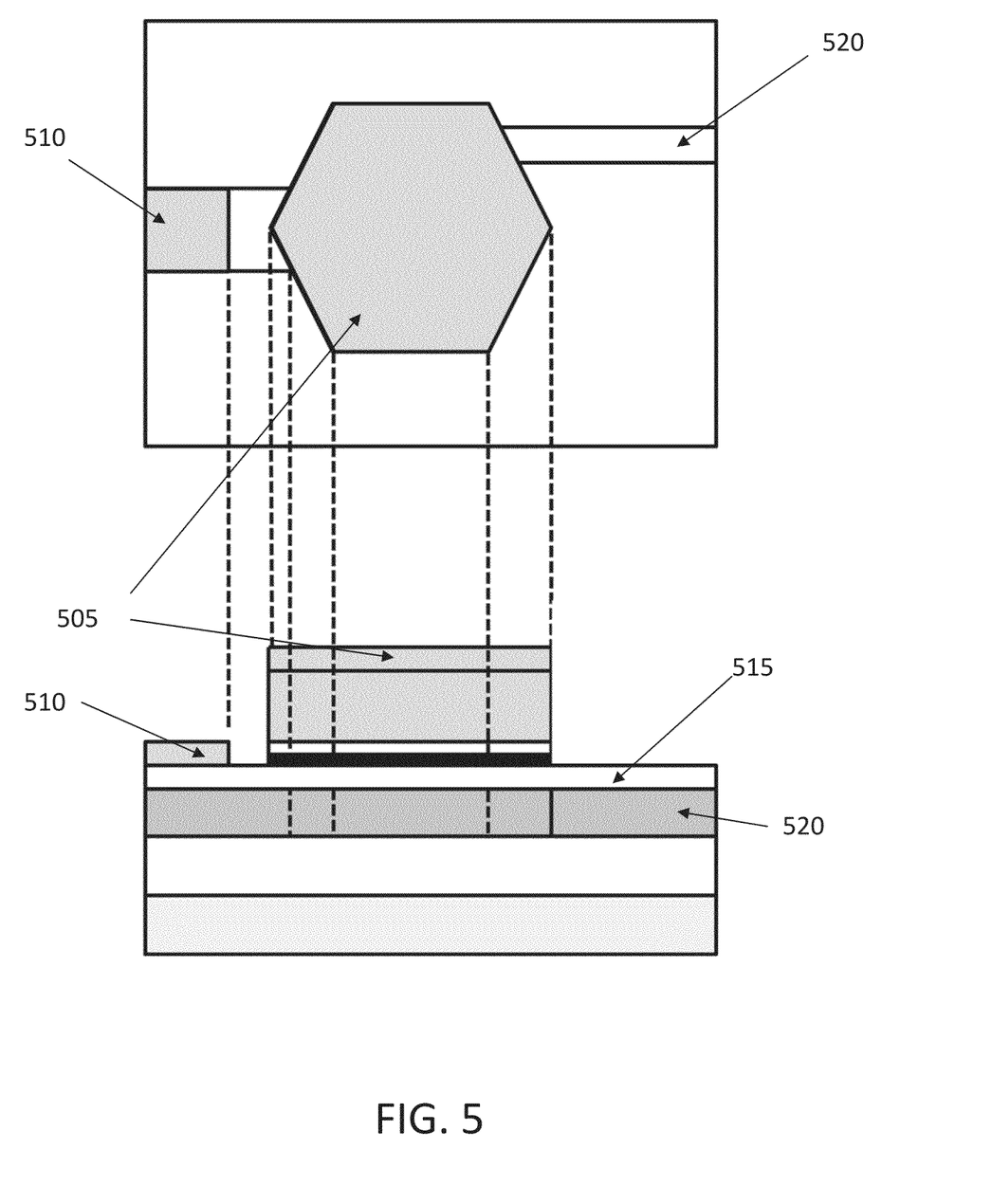

FIG. 2 illustrates a first exemplary step to fabricate an active microlaser (photonic crystal nanolaser) and a passive output waveguide on the same chip. Subsequent steps are illustrated in FIGS. 3-5. Each step is illustrated with both a top-down view and a side view simultaneously, to help visualize the three-dimensional configuration of the structure. The presented fabrication processes involve metal deposition, ICP-etching, several steps of aligned electron beam lithography, and so on, as understood by the person skilled in the art.

Referring to FIG. 2, the hexagonal mesa structure (205) is also visible in the subsequent steps in FIGS. 3-5 and forms the laser cavity, which is based on photonic crystals. As understood by the person skilled in the art, the fabrication of a photonic crystal involves the fabrication of air-holes in the structure, a step that is not shown in FIGS. 2-5.

Referring to FIG. 2, the mesa shape (205) is not limited to a particular hexagon and other shapes may be used. A person skilled in the art will understand how to fabricate III-V active QWs from the passive silicon waveguide, based on these diagrams. After the last fabrication step in FIG. 5, it is possible to add one more step to remove the remaining thin InGaAsP layer on top of the passive silicon waveguide by selective wet-chemical etching.

Referring to FIG. 2, several layers correspond to those similarly numbered in FIG. 1. Referring to FIG. 2, such layers are: a silicon substrate (220), a silicon dioxide layer (225), a silicon layer (230), a n-InGaAsP layer (235), a InGaAsP quantum well (QW) layer (240), a p-InGaAsP layer (245) and a p-InP layer (250). Layer (240) may comprise barriers, as understood by the person skilled in the art. The layer (255) may be a metal layer.

FIG. 3 illustrates an exemplary subsequent step of fabrication, where a dry etching mask (305) has been defined on the structure in the shape, for example, of a hexagon. Such step may be done by several different techniques known to the person skilled in the art, such as photolithography.

FIG. 4 illustrates an exemplary subsequent step of fabrication, where etching has been carried through several layers up to the n-InGaAsP layer (405).

The active part of the mesa structure (415) is element (410).

FIG. 5 illustrates an exemplary subsequent step of fabrication, where the etch mask has been removed and the top layer of the mesa is now the metal layer (505). Additionally, a lateral metal layer (510) has been added on top a portion of the n-InGaAsP layer (515). In some embodiments, layer (510) and layer (505) are two electrodes. Layers (520) can act as waveguides.

Figure 6:
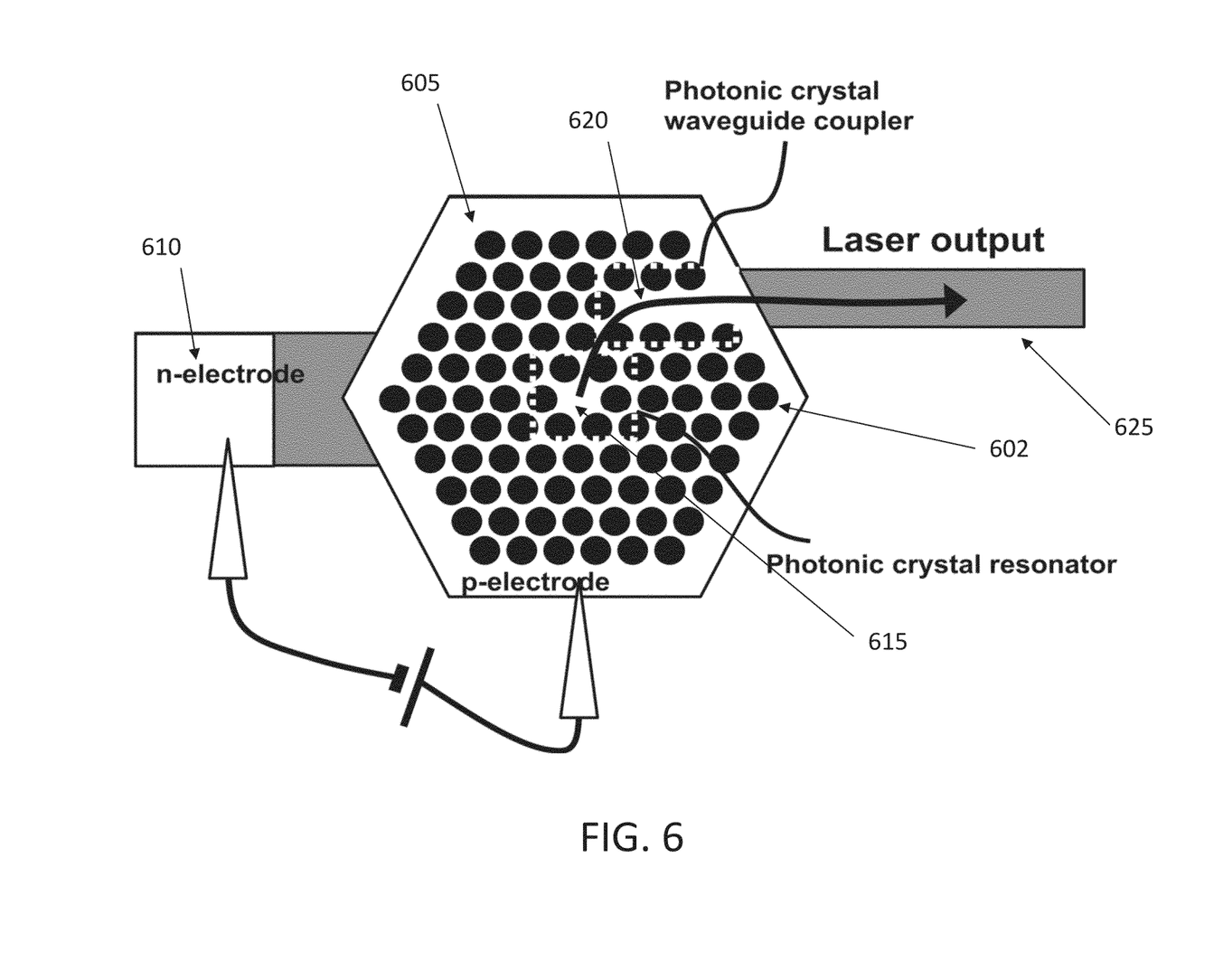
FIG. 6 illustrates an exemplary operation of the microlaser.

FIG. 6 illustrates an exemplary operation of the device, through a top view cross section that shows also the air-holes (602). A voltage generator can be connected to the electrode on the hexagonal mesa structure (605) and the electrode (610). The central zone (615) of the photonic crystal is the resonator, as will be understood by the person skilled in the art. A photonic crystal waveguide coupler (620) can also be present in the mesa structure, connecting it to the waveguide (625).

As exemplified in FIG. 6, the laser can be operated by electrical current flowing and the laser output generated can be coupled into a silicon ridge waveguide (625). The two electrodes (605, 610), one (605) on the top surface of the III-V active mesa and the other (610) on the side of the mesa, can form a closed circuit for flowing current through the p-i-n diode structure of the microlaser. One advantage of the structures of the present disclosure is the inclusion of photonic crystal air-holes within the mesa area. The photonic crystal pattern can shrink the size of an optical mode down to the sub-wavelength scale, without incurring in the increase of electrical resistance of the p-i-n diode.

Figure 7:
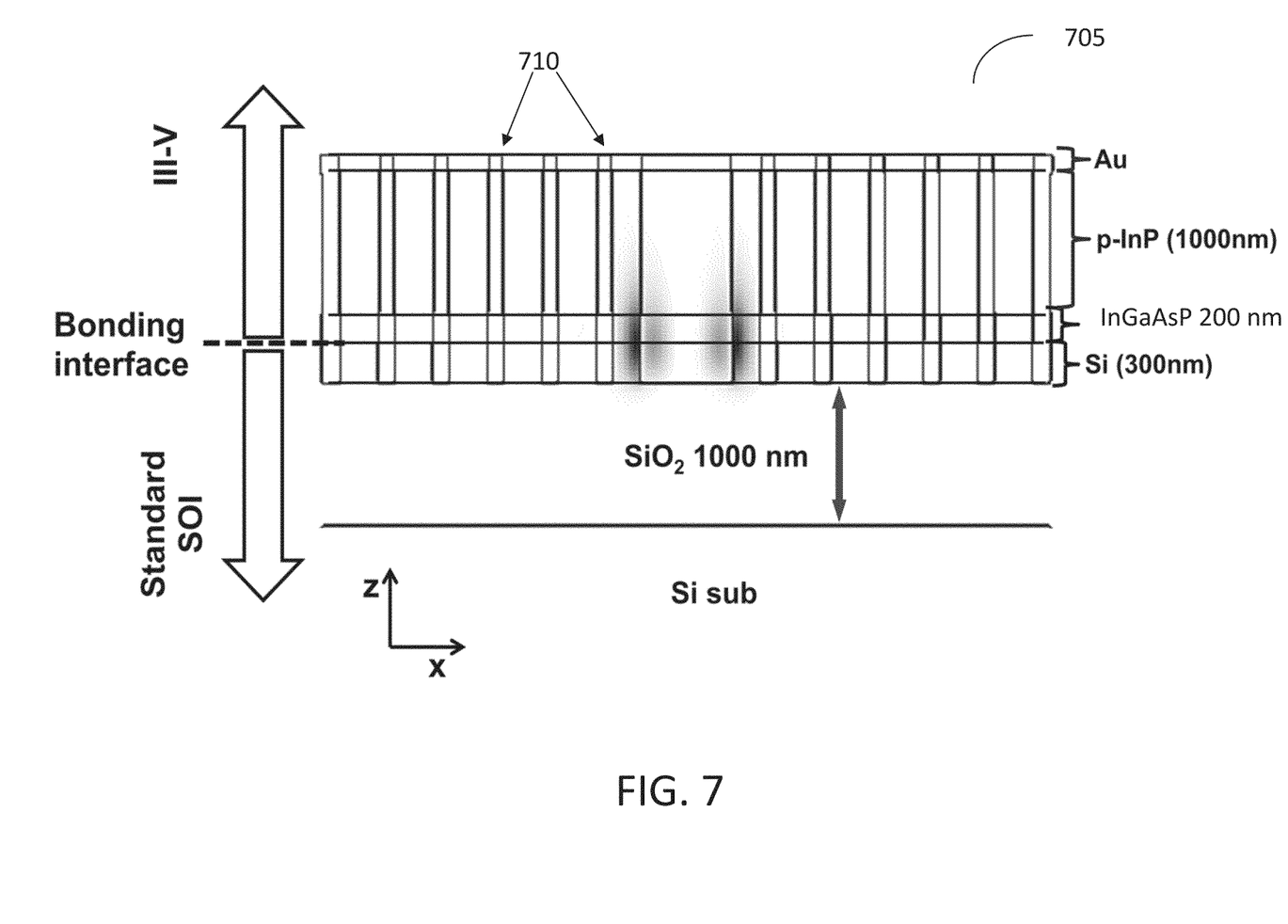
FIG. 7 shows a finite-difference time-domain (FDTD) simulation of one possible laser design

FIG. 7 shows a finite-difference time-domain (FDTD) simulation of one possible laser design (side view) based on the bonded wafer structure shown in FIG. 1. The overall geometry resembles a hexagonal pillar (705) containing photonic crystal air-holes (710). Refractive indices (n) assumed in this simulation are: n(InP)=3.168, n(InGaAsP)=3.39, n(Si) =3.478, and n(SiO2)=1.528, all of which are for a wavelength of 1.55 micrometers. The lattice constant of the triangular photonic crystal for the simulation was chosen to be 400 nm. With all the above parameters, a resonant wavelength of the hexapole mode is expected to be at 1528 nm. The quality factor of this hexapole mode could reach about 7000, which is more than enough to achieve a lasing threshold using InGaAsP QWs.

Figure 8:
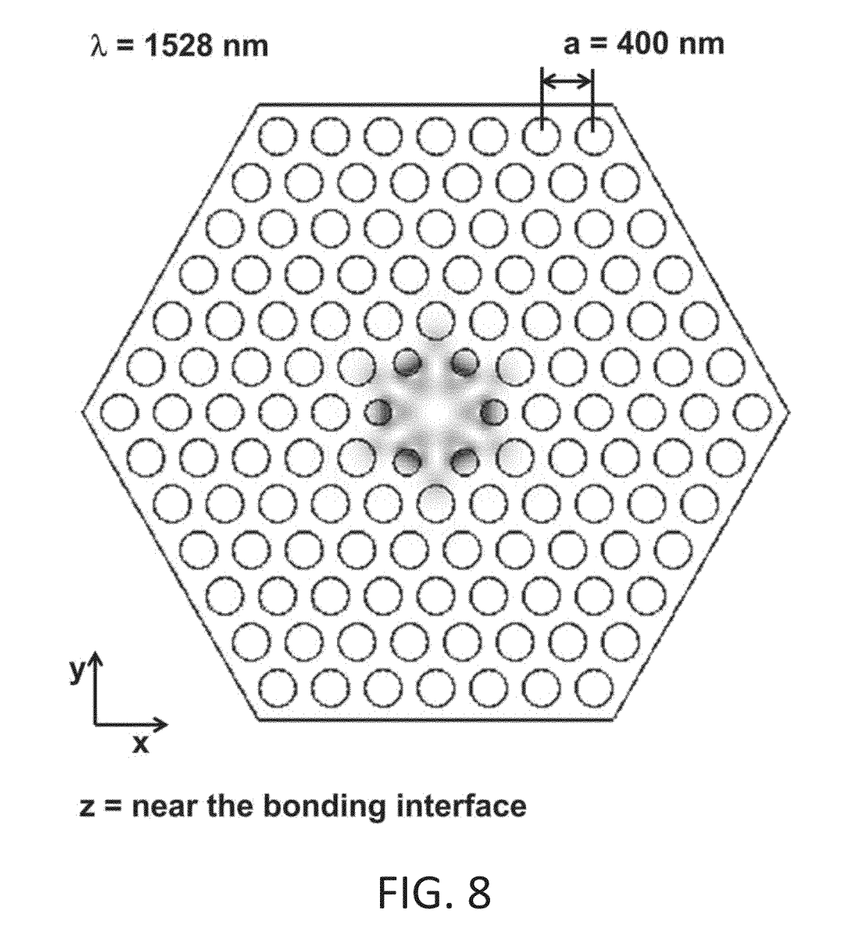
FIG. 8 illustrates a top view of the simulation of FIG. 7.

FIG. 8 illustrates a top view of the simulation of FIG. 7.

Figure 9:
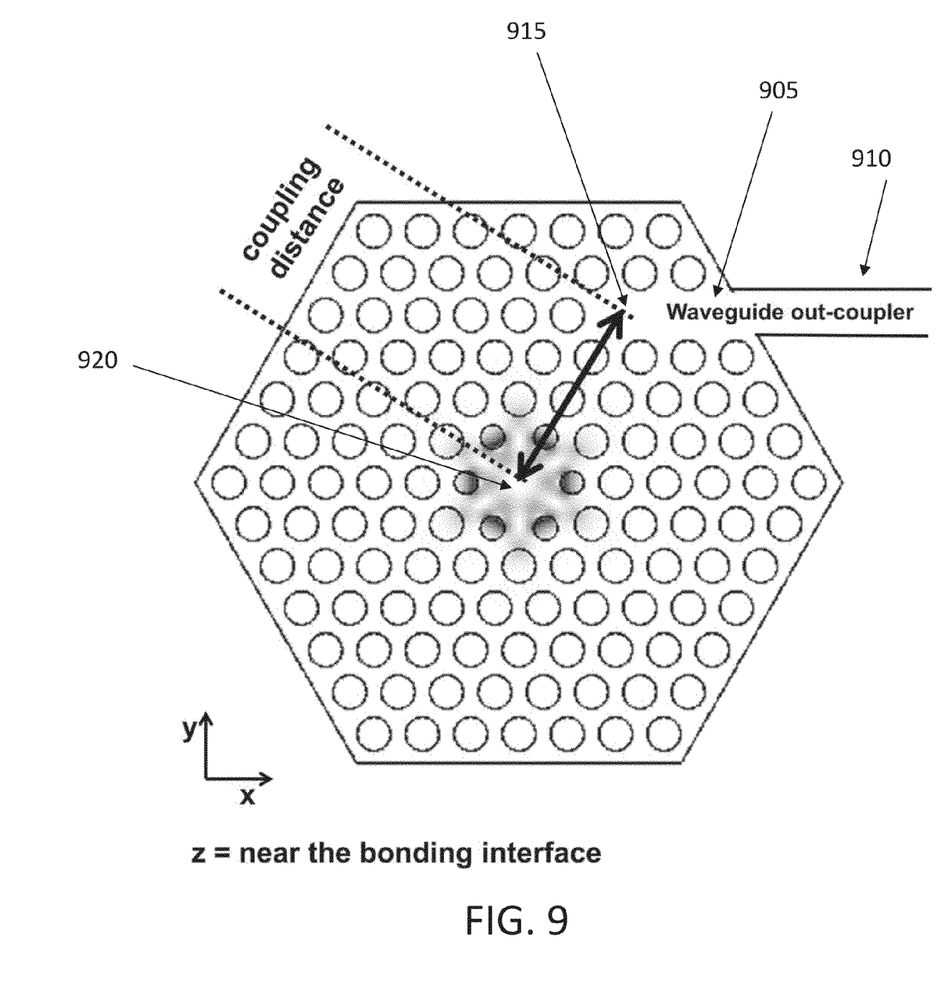
FIG. 9 illustrates a potential coupling of the microlaser and the waveguide.

As an active light source optically-powering a silicon photonics circuitry, the laser output should be coupled into the in-plane direction. One potential geometry is schematically illustrated in FIG. 9. A row of missing air-holes in the mesa region defines a waveguide (905), called a photonic crystal waveguide, as described for example in U.S. Pat. No. 6,643, 439 B2 "Photonic crystal waveguide", the disclosure of which is incorporated herein by reference in its entirety. This photonic crystal waveguide (905) is coupled to a conventional ridge waveguide (910). The physical distance between the starting point (915) of the photonic crystal waveguide (905) and the center of the laser cavity (920) determines a coupling strength.

Figure 10:
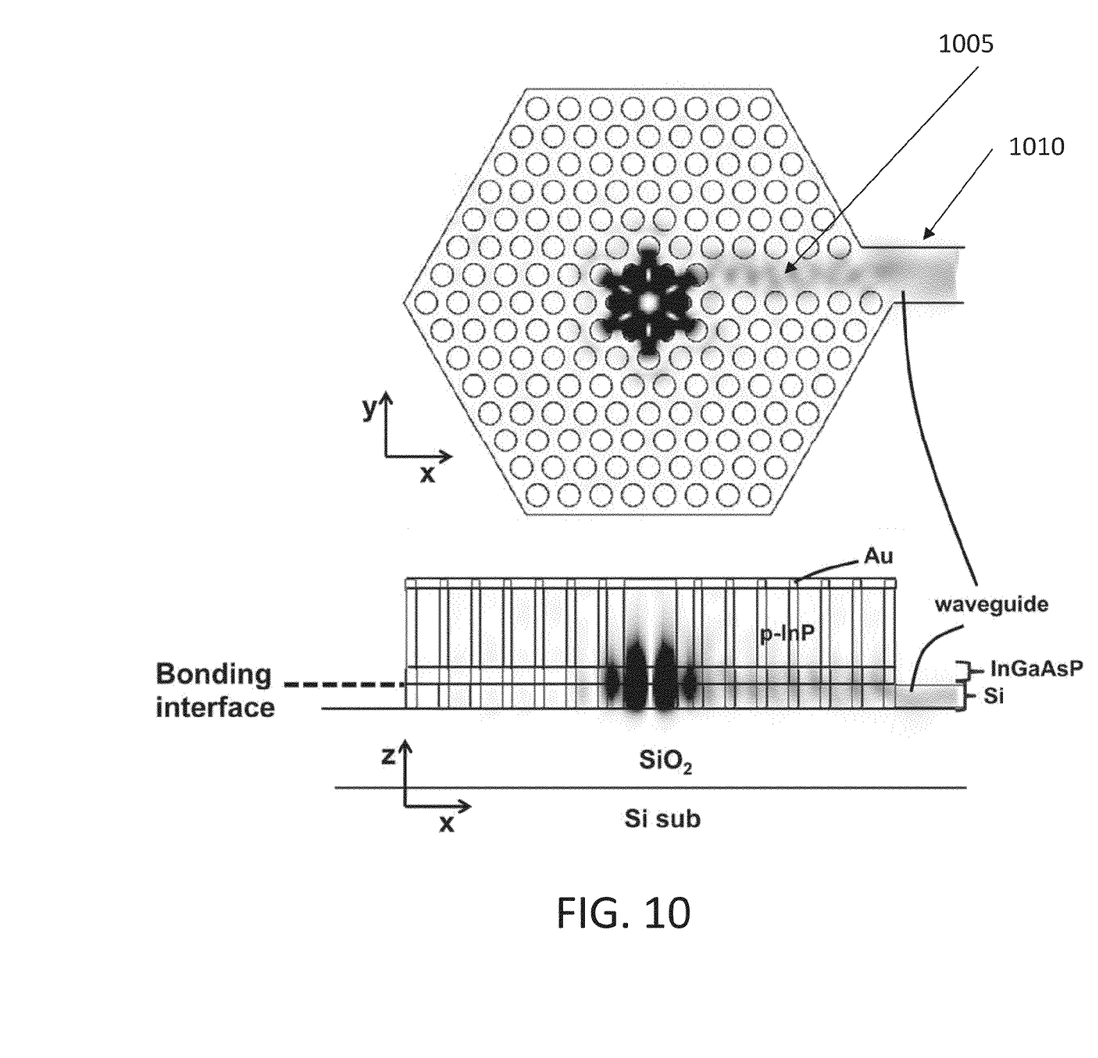
FIG. 10 illustrates another FDTD simulation.

Another FDTD simulation result is shown in FIG. 10. The active photonic crystal laser part is essentially same as the design shown in FIGS. 8-9, however a coupler (1005) section is now included. Based on the coupler (1005) design in FIG. 10, more than 90% of the generated laser output can couple to the adjacent silicon ridge waveguide (1010).

The photonic crystal region is defined in the III-V semiconductor region and in the adjacent silicon layer. Photonic crystal air-holes are etched through both of the III-V semiconductor region and the adjacent silicon layer. For example, referring to FIG. 1, the air-holes can be etched through the III-V semiconductor layers (150, 145, 140, 135) as well as the silicon layer (130). In some embodiments, the air-holes can also be etched through a metal layer electrode on top of layer (150). The etching of the air-holes can be carried out after the step of FIG. 5. For example, the air-holes can be defined by dry-etching. As understood by the person skilled in the art, the silicon dioxide layer (125) can act as an etch stop, due to the large etch rate difference between the silicon dioxide layer (125) and the Si layer (130). Therefore, the silicon layer (130) can be a silicon photonic crystal region, similarly to the III-V layers (150, 145, 140, 135). The III-V layers (150, 145, 140, 135) and the silicon layer (130) can form a photonic crystal region. The III-V region may comprise a quantum well structure as well as an n-type layer, a p-type layer, and barriers to confine carriers inside the quantum well. The III-V region may also comprise a III-V semiconductor layer or substrate.

In some embodiments, the air holes are arranged periodically to form a photonic structure, but are absent from a center region of the photonic crystal in order to form a resonator, and can also be absent from an edge region in order to form a photonic crystal waveguide. The sum area of the resonator and of the photonic crystal waveguide is smaller than the area of the photonic crystal occupied by air-holes.

Any of the depositing steps during fabrication can be carried out by molecular beam epitaxy, laser deposition, e-beam deposition, sputtering or other techniques known to the person skilled in the art.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

What is claimed is:

1. A method for fabricating a photonic crystal microlaser structure, the method comprising:
   providing a silicon-on-insulator substrate, the silicon-on-insulator substrate comprising
      a silicon substrate;
      a silicon dioxide layer contacting the silicon substrate; and
      a silicon layer contacting the silicon dioxide layer;
   providing a III-V semiconductor substrate;
   depositing a p-type layer on the III-V semiconductor substrate;
   depositing a quantum well structure on the p-type layer;
   depositing an n-type layer on the quantum well structure;
   bonding the n-type layer to the silicon layer;
   depositing a first electrode on the III-V semiconductor substrate;
   defining a mesa structure, the mesa structure comprising
      the first electrode;
      the III-V semiconductor substrate;
      the quantum well structure;
      the p-type layer; and
      the silicon layer;
   depositing a second electrode on the n-type layer;
   defining air-holes in the mesa structure, wherein the mesa structure comprises
      a center region,
      an edge region, and
      a remaining region, the remaining region having a greater area than the sum area of the center region and of the edge region, and wherein
      the air holes are periodically arranged in the remaining region, thereby creating a photonic crystal structure with a resonator and a photonic crystal waveguide; and
   defining a silicon ridge waveguide, the silicon ridge waveguide being configured to couple to the photonic crystal waveguide.

2. The method of claim 1, wherein defining the mesa structure comprises depositing an etch mask on the first electrode; and
etching the first electrode, the III-V semiconductor substrate, the quantum well structure, the p-type layer, and the silicon layer.

3. The method of claim 1, wherein any of the depositing steps is carried out by molecular beam epitaxy, laser deposition, e-beam deposition, or sputtering.

4. The method of claim 2, wherein the etching is carried out by dry etching.

* * * * *